United States Patent
Cipolla et al.

[19]

[11] Patent Number: 6,031,716
[45] Date of Patent: Feb. 29, 2000

[54] COMPUTER INCORPORATING HEAT DISSIPATOR WITH HINGED HEAT PIPE ARRANGEMENT FOR ENHANCED COOLING CAPACITY

[75] Inventors: Thomas Mario Cipolla, Katonah, N.Y.; Joseph Anthony Holung, Wake Forest, N.C.; Vinod Kamath, Raleigh, N.C.; Mohanlal Savji Mansuria, Apex, N.C.; Lawrence Shungwei Mok, Brewster, N.Y.; Tin-Lup Wong, Chapel Hill, N.C.

[73] Assignee: International Business Machines Corporation, Armonk, N.Y.

[21] Appl. No.: 09/149,838

[22] Filed: Sep. 8, 1998

[51] Int. Cl.$^7$ ........................................... H05K 7/20
[52] U.S. Cl. .................. 361/687; 165/104.33; 174/15.2; 361/700; 361/704
[58] Field of Search ................................ 165/86, 104.33; 174/15.2; 361/687–688, 700, 704, 707, 715

[56] References Cited

U.S. PATENT DOCUMENTS

| | | |
|---|---|---|
| 5,313,362 | 5/1994 | Hatada et al. . |
| 5,588,483 | 12/1996 | Ishida ...................................... 361/687 |
| 5,621,613 | 4/1997 | Haley et al. ............................ 361/687 |
| 5,646,822 | 7/1997 | Bhatia et al. . |

FOREIGN PATENT DOCUMENTS 272263  3/1996  Taiwan .

OTHER PUBLICATIONS

Albert Yu, "The Future of Microprocessors", *IEEE Micro*, Dec. 1996, pp. 46–53.

Masataka Mochizuki, et al., "Hinged Heat Pipes For Cooling Notebook PCs", *Thirteenth IEEE Semi–Therm™ Symposium*, 1997, pp. 64–72.

*Primary Examiner*—Gregory Thompson
*Attorney, Agent, or Firm*—Scully, Scott, Murphy & Presser; Daniel P. Morris, Esq.

[57] ABSTRACT

An arrangement and method for enhancing the cooling capacity of portable personal computers. More particularly, the arrangement is employed for increasing the cooling capacity of portable personal computers, particularly such as laptop or notebook computers, wherein the computer possesses a keyboard housing having the rear edge thereof hingedly connected with the bottom of an openable display unit or panel, and containing heat-generating computer electronics, from which heat is removed through the intermediary of heat pipes which are hingedly connected with at least one heat dissipator located in the display unit.

26 Claims, 6 Drawing Sheets

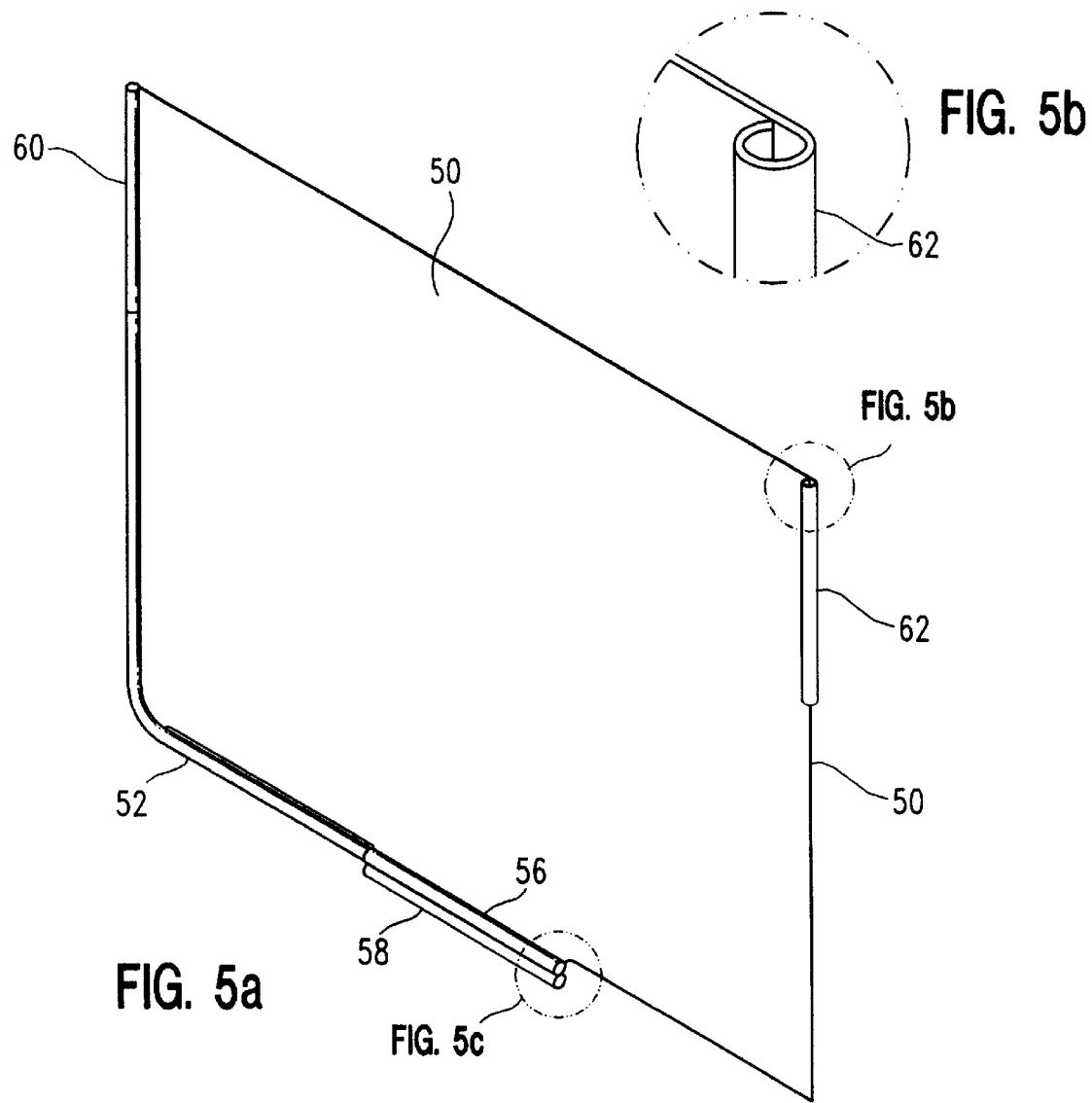
FIG. 5a
FIG. 5b
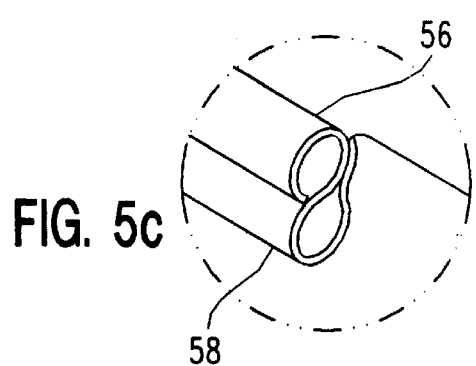
FIG. 5c

COMPUTER INCORPORATING HEAT DISSIPATOR WITH HINGED HEAT PIPE ARRANGEMENT FOR ENHANCED COOLING CAPACITY

BACKGROUND OF THE INVENTION

The present invention relates to an arrangement for enhancing the cooling capacity of portable personal computers. More particularly, the invention is directed to the provision of an arrangement for increasing the cooling capacity of portable personal computers, particularly such as laptop or notebook computers, wherein the computer possesses a keyboard having the rear edge thereof hingedly connected with the bottom of an openable display unit or panel, and containing heat-generating computer electronics, from which heat is removed through the intermediary of heat pipes which are hingedly connected with at least one heat dissipator located in the display unit.

Commencing from the time of conception and design development of computers, and especially portable personal computers; for instance such as laptop computers or the like, there has been encountered the aspect of thermal management as a result of heat which is generated by the processor and other electronic components of the computer. As is widely known in the computer technology, excessive amounts of heat can readily degrade the performance of computers, and additionally may cause the components of the computers to be damaged. Consequently, thermal management is frequently considered to be an extremely important aspect in the design and development of computers.

The capacity and performance of portable personal computers, such as laptop computers, notebook computers or the like, has recently been enhanced to such an extent that; for example, since the beginning of 1996, the thermal dissipation requirements of portable personal computers (PCS) have increased from about 10 watts to 25 watts and even higher values. This increase in the thermal dissipation requirements is a result of ever increasing CPU performance and additional functionality; such as DVD, modem, audio and the like, which are provided by future PCS. As elucidated in an article by Albert Yu, "The Future of Microprocessors", IEEE Micro, December 1996, pages 46 through 53, the trend of increasing power dissipation in the form of heat for portable personal computers will continue in the foreseeable future. Thus, at the widely employed A4 form factor for a portable personal computer; in essence, a 297 by 210 mm footprint, for instance, the cooling limit for a portable PC without an active cooling device, such as a cooling fan or providing additional passive cooling capacity is currently approximately 15 to 20 watts. Although cooling capacity can be added through the installation of an active cooling device, such as a fan, this is normally not desirable inasmuch as these devices take up space, consume power and generate noise. Particularly in a portable personal computer, space and battery consumption and life is at a premium, and the generating of noise is deemed to be highly undesirable. As a result, active cooling devices have been employed as a last resort in attempts to obtain additional cooling capacity. In contrast therewith, passive cooling methods and arrangements are considered to be most desirable and efficient since they do not consume any power, generate no noise and quite often take up no additional space. Thus, providing a greater cooling capacity than the current limits in order to meet the anticipated thermal dissipation requirements of future portable personal computers, represents not only a potential competitive advantage in industry, but also provides a significant product differentiation from currently available and commercially sold portable personal computers.

In particular with regard to the power consumption of laptop computers, there has been recently a continued increase in the power of the CPU. For example, the total of power of a laptop computer is normally about 10 watts, and has now increased to a range of about 30 to 40 watts or higher, whereas the CPU power has been increased from about 2 to 6 watts and, conceivably, can be as high as in the 10 watt range. Most of this power will eventually be dissipated in the form of heat to the surroundings. Consequently, being able to remove increased amounts of heat from the laptop computer becomes a critical factor in the construction and operation of such laptop computers.

DISCUSSION OF THE PRIOR ART

Various arrangements and devices for increasing the cooling capacities of laptop computers are currently known in the technology.

Ishida, U.S. Pat. No. 5,588,483 discloses a heat radiating apparatus for a computer possessing a heat pipe which is connected to a heat radiating plate and a heat receiving plate, and a medium for heat transfer purposes. The heat pipe includes an internal space filled with a grease having a high thermal conductivity.

Hatada, et al., U.S. Pat. No. 5,313,362 discloses a laptop or notebook computer which incorporates radiator structure including fins for dissipating and eliminating heat generated therein through convection, and includes the utilization of heat pipes of various configurations.

Taiwanese Patent Publication TW 272263-A discloses a cooling device for portable personal computers which includes a heat pipe having one end connected to an electronic element and the other end connected to extend along the hinge of the computer so as to conduct heat therethrough from the electronic element.

Masatake, et al. "Hinged Heat Pipes for Cooling Notebook PCS", Thirteenth IEEE SEMI-THERM Symposium, 1997, discusses the utilization of hinged heat pipes for cooling notebook PCS. The apparatus disclosed in this publication provides for the interconnection of two heat pipes utilizing clamps. The apparatus employs dry contact and clamping force in order to maintain a thermal contact which is subject to mechanical wear and environmental contamination.

Bhatia, et al. U.S. Pat. No. 5,646,822 discloses a heat pipe exchange system which consists of two heat pipes which are brought together within a hollow sleeve filled with a thermally conductive grease. The heat exchange system does not address itself to any means of lowering the thermal resistance between the two heat pipes, which is considered to be critical in actual physical applications.

SUMMARY OF THE INVENTION

In order to increase the cooling capacity of portable personal computers; in effect, to be able to provide for the power dissipation which is present in the form of heat, particularly with regard to the cooling of laptop computers, although not limited thereto, the present invention provides for a formed heat dissipater which is mounted on an inner surface of the computer display panel or cover rearwardly of the display, and to a combination of fixed and rotating heat pipes communicating with the heat dissipator.

Pursuant to a particular embodiment of the invention, a single heat pipe extending from the computer electronics has a formed heat dissipator extending thereabout so as to form a hinged dissipator structure which is rotatable about the heat pipe when the display cover is being either opened or closed.

Pursuant to a modified embodiment of the invention, two additional heat pipes may be fastened to the rotatable dissipator in order to provide for enhanced degrees of heat dissipation from the portable personal computer or laptop computer.

Pursuant to further modified embodiments of the invention, additional heat dissipators may be employed to connect to either one, two, three or even greater number of heat pipes depending upon the requirements for the amount of heat which is to be dissipated, and so as to be able to thereby further enhance the level of power dissipation.

Accordingly, it is an object of the present invention to provide a novel arrangement for enhancing the thermal dissipation of portable personal computers, wherein a heat dissipator is mounted on an inner surface of a computer cover rearwardly of a display panel, and which includes a combination of fixed and rotating heat pipes.

Another object of the present invention, is to provide an arrangement utilizing a formed heat dissipator as described hereinabove, wherein a plurality of heat pipes may be interconnected with the rotatable heat dissipator for an enhanced dissipation of power so as to increase the heat dissipation capacity of the computer.

BRIEF DESCRIPTION OF THE DRAWINGS

Reference may now be had to the following detailed description of preferred embodiments of the invention, taken in conjunction with the accompanying drawings; in which:

FIG. 5(a) illustrates a detail of the heat dissipator disclosed in FIG. 3; FIGS. 5(b) and 5(c) respectively illustrate, on an enlarged scale, encircled detail regions of FIG. 5(a);

DETAILED DESCRIPTION OF PREFERRED EMBODIMENTS

Figure 1:
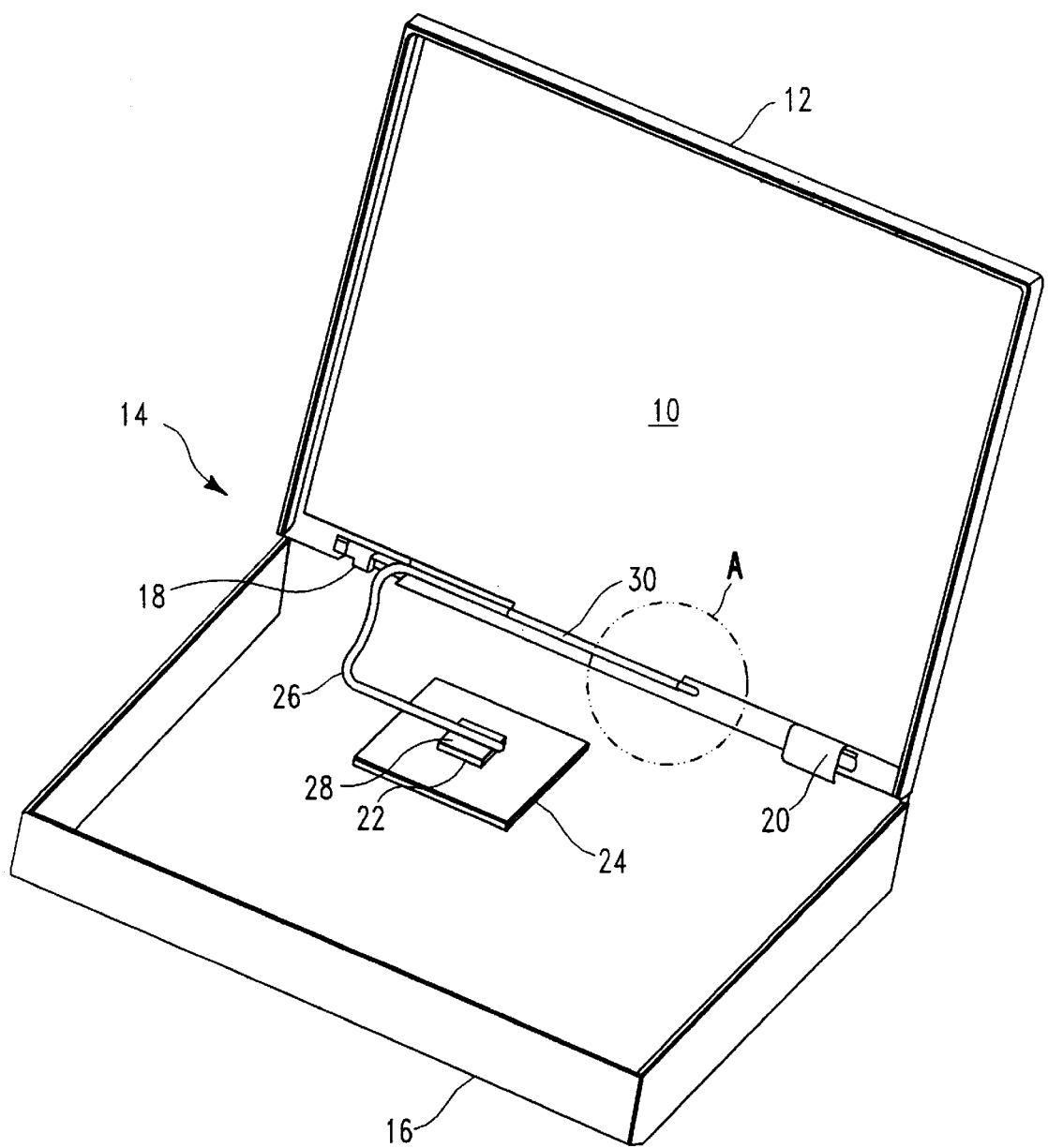
FIG. 1 illustrates, generally diagrammatically, a perspective view of a laptop computer with the cover containing the display panel shown in an opened position, and wherein the computer incorporates a heat dissipator mounted on a inner surface of the computer cover and in combination with a single heat pipe leading from the computer electronics.

Referring to FIG. 1, there is illustrated a first embodiment of a formed heat dissipator 10 which is mounted on the inner surface of the display cover 12 of a portable computer 14. The formed heat dissipator 10 is constituted of materials possessing a high thermal conductivity such as graphite fiber composite, copper, aluminum, magnesium, etc. and is glued to or otherwise anchored, as disclosed hereinbelow, to the inner surface of the display cover 12. The display cover 12 is adapted to contain a flat panel display, which is not shown in the drawing for purposes of clarity. The display cover 12 is connected to the base 16 of the portable computer 14 by mechanical hinges 18 and 20 such that the display cover 12 can be folded down and closed onto the base 16 when the computer 14 is not engaged in normal operation.

Figure 2:
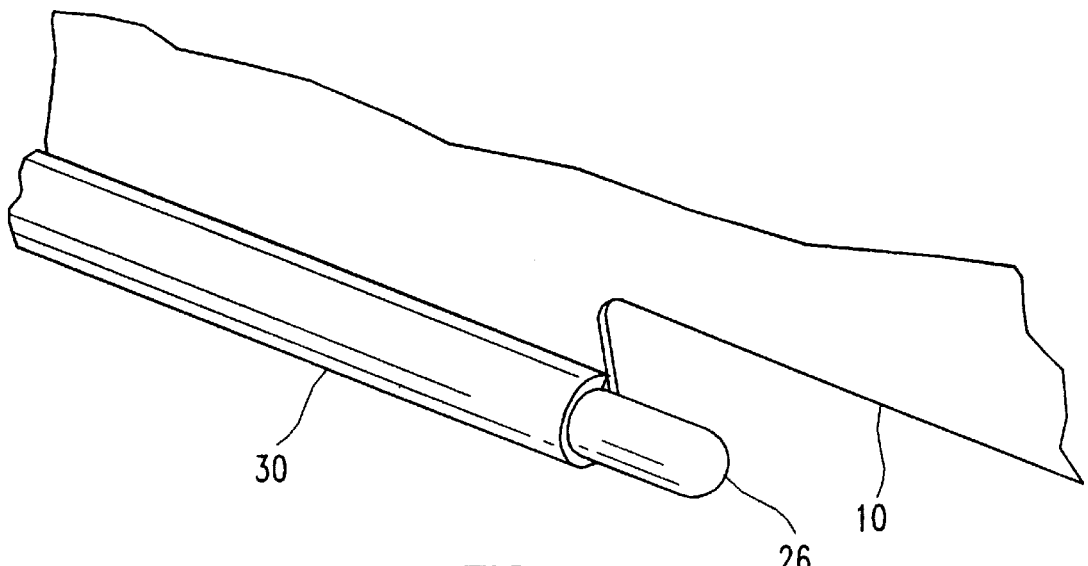
FIG. 2 illustrates, on an enlarged scale, a detail of the rotatable dissipator from the encircled portion A in FIG. 1.

A heat generating device; for example, such as a semiconductor chip 22 is mounted on a printed wiring board 24 which is positioned in the base 16 of the portable computer 14, the keyboard and other components not being shown for purpose of clarity. One end of a heat pipe 26 is attached to a heat spreader 28 in the base in a manner so as to maintain good thermal contact therewith; for instance through soldering. The spreader 28 consists of a material possessing a high thermal conductivity, such as copper or aluminum, and is also attached to the heat generating device, such as semiconductor chip 22, so as to maintain good thermal contact therewith, such constructions being essentially well known in the art. An opposite end of the heat pipe 26 is inserted into a sleeve 30 which is formed by rolling up one portion of the heat spreader 10; an enlarged detail view of the sleeve 30 and heat pipe 26 being shown in FIG. 2 as represented by circle A in FIG. 1. The heat pipe 26 is freely rotatable within the sleeve 30, the latter of which is arranged to extend coaxially with the mechanical hinges 18 and 20. The sleeve 30 is preferably rolled to a diameter which allows for a minimum clearance (less than 25 micrometers) between the inner surface of the sleeve 30 and the outer diameter of heat pipe 26 so as to minimize the thermal resistance therebetween. In order to obtain an even lower degree of thermal resistance and low mechanical fiction between components 26 and 30, conventional grease can be used to fill any air gaps between the inner surface of sleeve 30 and the outer diameter of heat pipe 26.

Figure 4:
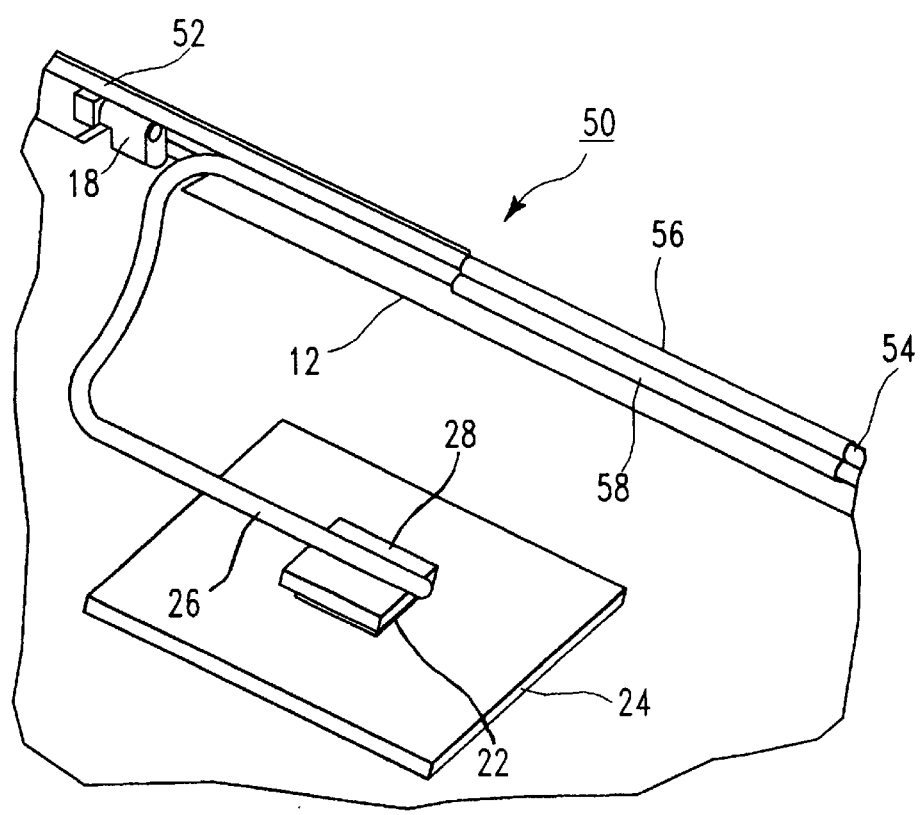
FIG. 4 illustrates, on an enlarged scale, the region in FIG. 3 wherein the hinge is formed by the fixed heat pipe and the rotatable heat dissipator.
Figure 3:
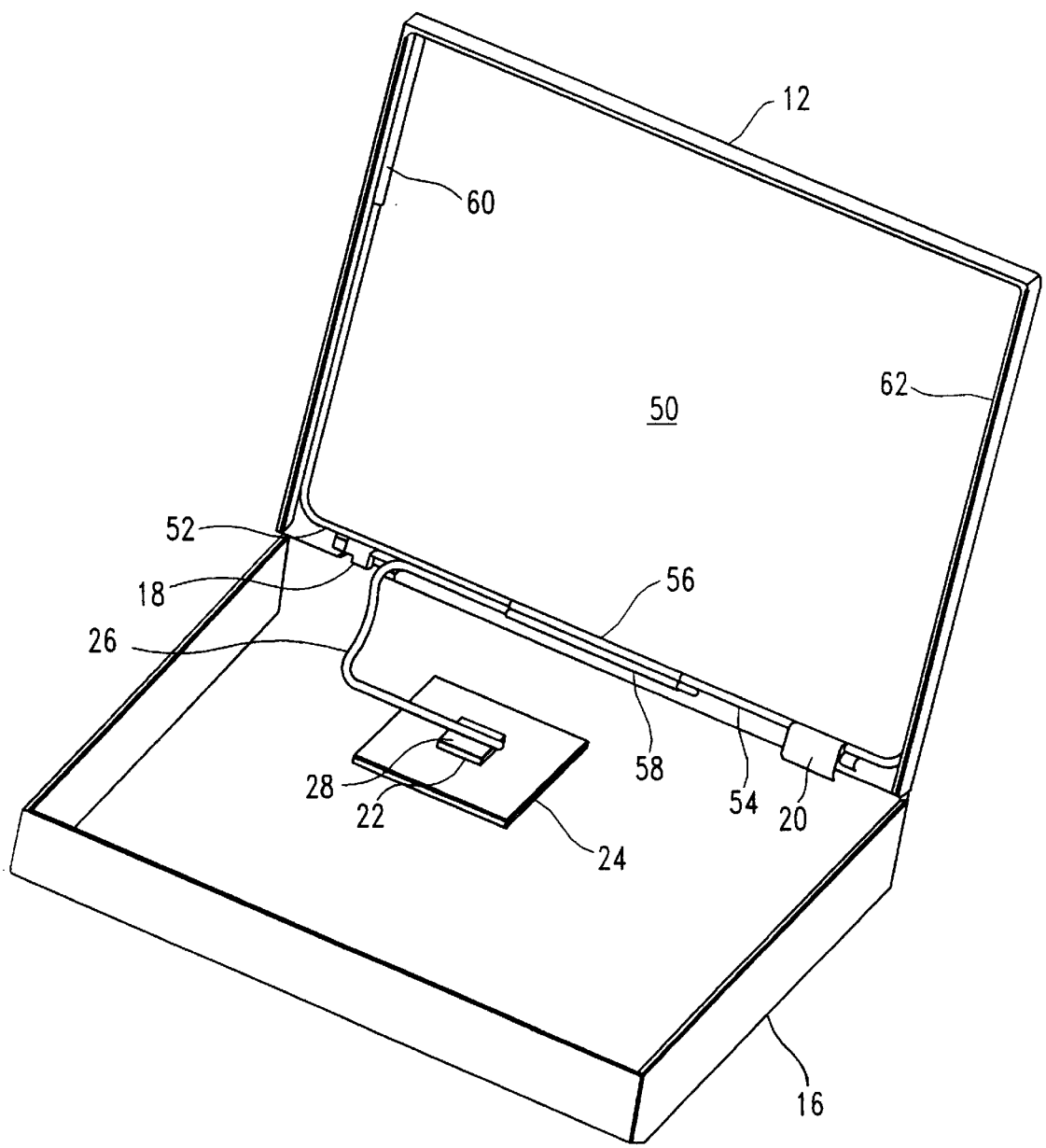
FIG. 3 illustrates, generally diagrammatically, a laptop computer similar to FIG. 1 with a modified embodiment of the heat dissipator structure providing for the inclusion of two additional heat pipes which are connected to the rotatable heat dissipator for an enhanced level of power dissipation.
Figure 6A:
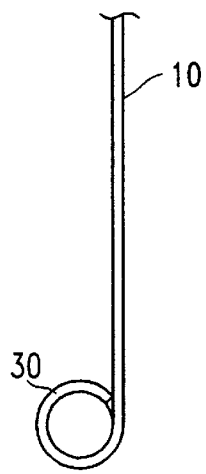
FIG. 6(a) through 6(h) illustrate, respectively, cross-sectional views of various constructional patterns of heat dissipator forming sleeves for connection to, respectively, one or more numbers of heat pipes.
Figure 6B:
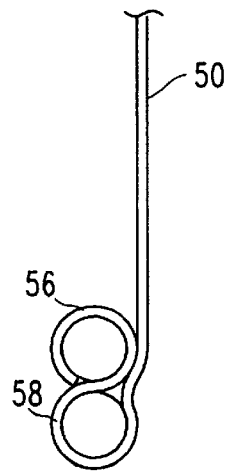
Figure 6C:
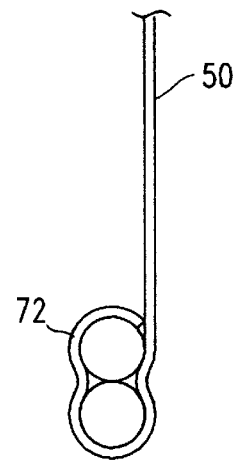
Figure 6D:
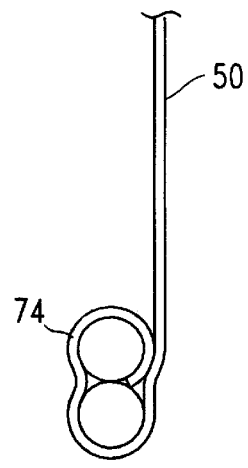
Figure 6E:
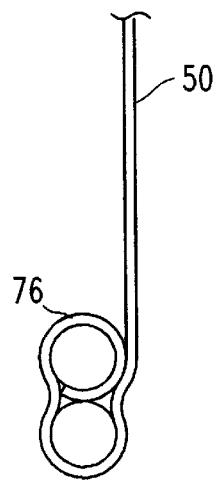
Figure 6F:
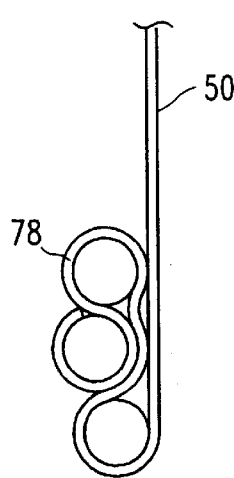
Figure 6G:
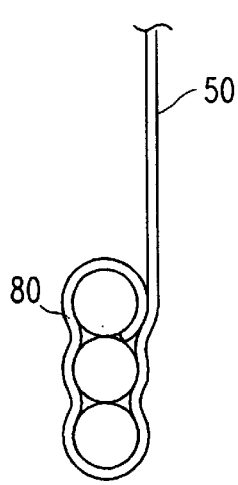
Figure 6H:
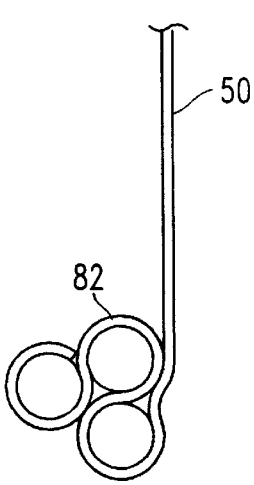

FIG. 3 illustrates another embodiment of the inventive formed heat dissipator 50 possessing with two fixed heat pipes 52 and 54 tandemly inserted into a second sleeve 56 formed of the dissipator material adjacent to a sleeve 58 which accepts heat pipe 26 in the same manner as does the first embodiment. The opposite end of heat pipe 26 is identical with that of the first embodiment, as shown in FIG. 4. The opposite ends of heat pipes 52 and 54 are inserted into respectively, further sleeves 60 and 62, and which are formed so as to extend along the sides or the top of dissipator 50, with the structure of the dissipator 50 being shown in FIG. 5a, and details from the encircled part in FIGS. 5b and 5c.

Inasmuch as heat pipes may possess a heat transfer rate which is equivalent to about 100 to 200 times the conductivity of copper, placing one or more secondary heat pipes on the dissipator 50 will transfer heat quickly from the attachment point at one end of the heat pipe to the other attachment point at the other end of the heat pipe, which is effectively pumping heat to several spatially separated locations on the dissipator and which spreads the heat further, thus making the dissipator more effective. This increase in the heat dissipating effectiveness allows for the use of thinner material for the dissipator, and resultingly reducing the weight, size and cost of the dissipator.

The number of fixed heat pipes is not limited to two as shown in the embodiment of FIGS. 3 to 5a–5c. Hereby, FIGS. 6a through 6h show several examples of formed heat dissipator embodiments which may be rolled to form other sleeve configurations 72, 74, 76, 78, 80 and 82 for connection to one, two, three or even more heat pipes.

Figure 7:
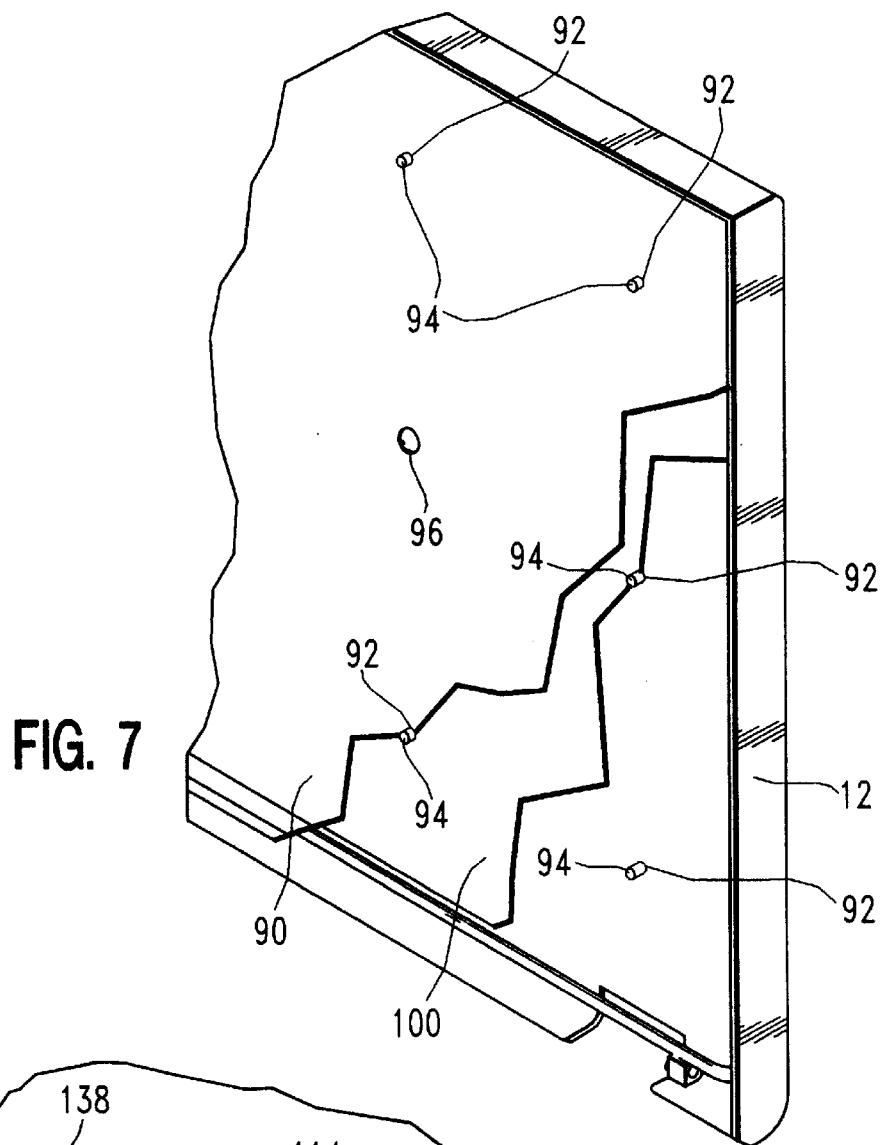
FIG. 7 illustrates, perspectively, a portion of the display panel cover of the laptop computer, showing a method in which a formed heat dissipator may be mounted on the display panel cover.

FIG. 7 shows how a formed heat dissipator 90 may be anchored to a display cover 12. Several small holes 92 may be punched into heat dissipator 90 which align with projections 94 molded into the plastic material of cover 12. After inserting the projections 94 through the holes 92, a head or bead is thermally or ultrasonically formed on each projection, as shown on deformed projection 96 so as to retain dissipator 90 in place within the cover. An optional thermal interface sheet 100 may be positioned between the dissipator 90 and the display cover 12 to thereby enhance the extent of heat transfer from dissipator 90 to the display cover 12. An alternative manner of attaching dissipator 90 to the cover 12 may be the use of an adhesive such as thermal epoxy instead of the holes 92 and projections 94, 96.

Figure 8:
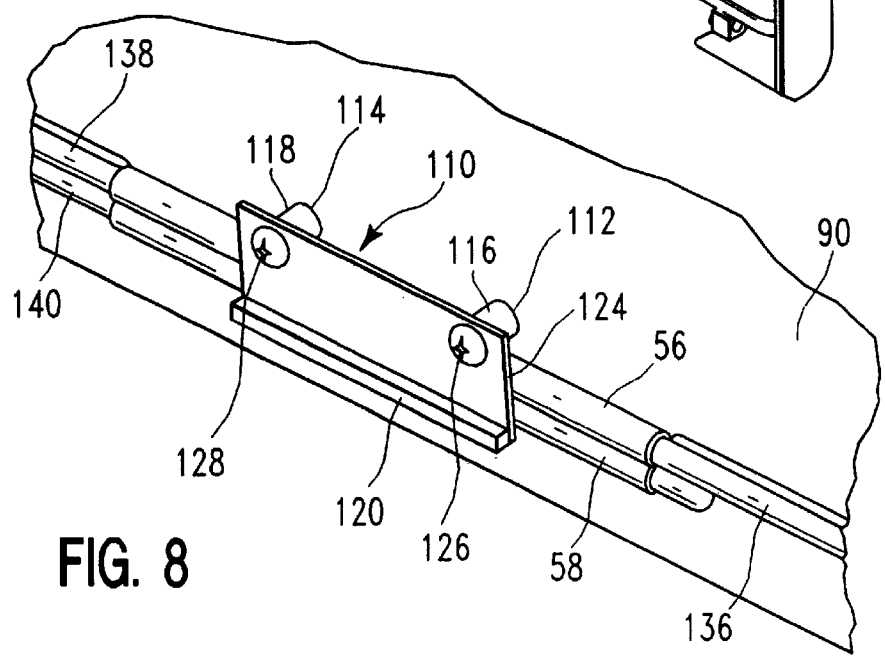
FIG. 8 illustrates, in a perspective view, a bracket structure optionally employable for securing the heat dissipator and heat pipes to the display cover.

FIG. 8 illustrates an optional clamp 110 which may be employed to secure and compress sleeves 56 and 58. The dissipator is provided with two holes 112 and 114 through which there protrude bosses 116 and 118. Bosses 116 and 118 are molded into the display cover 12. Also molded into display cover 12 is a lip 120 onto which there hooks a plate 124, and is further secured by means of screws 126 and 128 which thread into bosses 116 and 118. This clamping structure further ensures that a good thermal contact will be present between the inside surfaces of sleeves 56 and 58 and heat pipes 136, 138, 140.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

Having thus described our invention, what we claim as new, and desire to secure by Letters Patent is:

1. An arrangement for dissipating heat generated by at least one electronic component of a computer having a bottom housing for a keyboard and a display panel hingedly connected to a rear edge of said housing, said at least one electronic component being located in said housing, said heat dissipating arrangement comprising at least one heat pipe formed from a length of tubing having one end axially coextensive with the hinge connection between said housing and said display panel, an opposite end of said at least one heat pipe being connected to said at least one heat-generating electronic component; and heat dissipator means at a rear surface of said display panel having heat transferred thereto by said at least one heat pipe from said electronic components to said heat dissipator means, said heat dissipator means including at least one rolled sleeve formed at one edge thereof, said rolled sleeve being axially coextensive with said hinge connection and with said at least one heat pipe having the one end thereof which axially coextends with said hinge connection extending through said sleeve, said heat dissipator means further including a plate element in the form of a sheet mounted on an interior surface of said display panel for dissipating heat to the surroundings, said interior surface of said display panel including a plurality of mutually spaced protruding projections, said sheet having apertures formed therein in alignment with said projections to facilitate said projections extending through said apertures, protruding end portions of said projections being deformed to provide heads for anchoring said sheet to the interior surface of said display panel.

2. An arrangement as claimed in claim 1, wherein said at least one heat pipe and said at least one sleeve of the heat dissipator means are rotatably movable relative to each other responsive to pivoting movement of said display panel about said hinge connection.

3. An arrangement as claimed in claim 1, wherein said heads are thermally or ultrasonically formed on said projections.

4. An arrangement as claimed in claim 1, wherein said sheet is adhesively fastened to the interior surface of said display panel.

5. An arrangement as claimed in claim 1, wherein said at least one rolled sleeve is integrally formed with said plate element of said heat dissipator means.

6. An arrangement as claimed in claim 1, wherein a plurality of said rolled sleeves are formed along said edge of said heat dissipator means, said sleeves extending in contacting parallel relationship with each other.

7. An arrangement as claimed in claim 6, wherein each said rolled sleeve is adapted to receive respectively one said heat pipe.

8. An arrangement as claimed in claim 1, wherein rolled sleeve portions are formed along side or top edges of said plate element interiorly of said display panel for receiving heat pipes to enhance the dissipation of heat by said heat dissipator means.

9. An arrangement as claimed in claim 1, wherein said heat dissipator means is constituted of a material possessing a high thermal conductivity.

10. An arrangement as claimed in claim 9, wherein said heat dissipator means material is selected from the group of materials consisting of a woven graphite fiber composite, copper, aluminum or magnesium.

11. An arrangement as claimed in claim 1, wherein a thermal interface sheet is interposed between said heat dissipator plate element and the interior surface of said display panel to enhance the transfer of heat from the plate element to said display panel.

12. An arrangement as claimed in claim 5, wherein bracket means clampingly engage said at least one rolled sleeve to enhance thermal contact between said at least one rolled sleeve and said at least one heat pipe.

13. An arrangement as claimed in claim 1, wherein said computer is a laptop computer.

14. A method for dissipating heat generated by at least one electronic component of a computer having a bottom housing for a keyboard and a display panel hingedly connected to a rear edge of said housing, said at least one electronic component being located in said housing, said heat dissipating arrangement comprising positioning at least one heat pipe formed from a length of tubing to have one end axially coextensive with the hinge connection between said housing and said display panel, connecting an opposite end of said at least one heat pipe to said at least one heatgenerating electronic component; and locating heat dissipator means at a rear surface of said display panel having heat transferred thereto by said at least one heat pipe from said at least one electronic component to said heat dissipator means, providing said heat dissipator means with at least one rolled sleeve formed at one edge thereof, said rolled sleeve being axially coextensive with said hinge connection and with said at least one heat pipe having the one end thereof which axially coextends with said hinge connection extending through said sleeve, said heat dissipator means comprising mounting a plate element in the form of a sheet on an interior surface of said display panel for dissipating heat to the surroundings. said interior surface of said dislay panel including a plurality of mutually spaced protruding projections, said sheet having apertures formed therein in alignment with said projections to facilitate said projections extending through said apertures, protruding end portions of said prolections being deformed to provide heads for anchoring said sheet to the interior surface of said display panel.

15. A method as claimed in claim 14, wherein said at least one heat pipe and said at least one sleeve of the heat dissipator means are rotatably movable relative to each other responsive to pivoting movement of said display panel about said hinge connection.

16. A method as claimed in claim 14, wherein said heads are thermally or ultrasonically formed on said projections.

17. A method as claimed in claim 14, wherein said sheet is adhesively fastened to the interior surface of said display panel.

18. A method as claimed in claim 14, wherein said at least one rolled sleeve is integrally formed with said plate element of said heat dissipator means.

19. A method as claimed in claim 14, wherein a plurality of said rolled sleeves are formed along said edge of said heat dissipator means, said sleeves extending in contacting parallel relationship with each other.

20. A method as claimed in claim 18, wherein each said rolled sleeve is adapted to receive respectively one said heat pipe.

21. A method as claimed in claim 14, wherein rolled sleeve portions are formed along side or top edges of said plate element interiorly of said display panel for receiving heat pipes to enhance the dissipation of heat by said heat dissipator means.

22. A method as claimed in claim 14, wherein said heat dissipator means is constituted of a material possessing a high thermal conductivity.

23. A method as claimed in claim 22, wherein said heat dissipator means material is selected from the group of materials consisting of a woven graphite fiber composite, copper, aluminum or magnesium.

24. A method as claimed in claim 14, wherein a thermal interface sheet is interposed between said heat dissipator plate element and the interior surface of said display panel to enhance the transfer of heat from the plate element to said display panel.

25. A method as claimed in claim 18, wherein bracket means clampingly engage said at least one rolled sleeve to enhance thermal contact between said at least one rolled sleeve and said at least one heat pipe.

26. A method as claimed in claim 14, wherein said computer is a laptop computer.

* * * * *

UNITED STATES PATENT AND TRADEMARK OFFICE
CERTIFICATE OF CORRECTION

PATENT NO. : 6,031,716
DATED : February 29, 2000
INVENTOR(S) : Thomas M. Cipolla, et al.

It is certified that error appears in the above-identified patent and that said Letters Patent is hereby corrected as shown below:

Column 6, line 22: "a dapted" should read --adapted--

Column 7, line 6, Claim 14: "prolections" should read --projections--

Signed and Sealed this

Sixth Day of March, 2001

Attest:

NICHOLAS P. GODICI

*Attesting Officer*  Acting Director of the United States Patent and Trademark Office